United States Patent [19]
VonWicklen

[11] Patent Number: 5,315,272
[45] Date of Patent: May 24, 1994

[54] LIGHT EMITTING TUNNEL DIODE OSCILLATOR

[75] Inventor: William E. VonWicklen, Oxnard, Calif.

[73] Assignee: Grumman Aerospace Corporation, Bethpage, N.Y.

[21] Appl. No.: 51,896

[22] Filed: Apr. 26, 1993

[51] Int. Cl.$^5$ .................. H03B 7/00; H05B 37/00
[52] U.S. Cl. ..................... 331/107 T; 315/72; 257/79; 257/104; 257/918
[58] Field of Search ............. 331/107 T, 185; 315/72, 315/167, 171, 172, 200 R, 246; 257/9, 13, 79, 104, 105, 106, 918

[56] References Cited

U.S. PATENT DOCUMENTS

| | | | |
|---|---|---|---|
| 3,560,750 | 2/1971 | Nagata | 257/79 X |
| 3,636,416 | 1/1972 | Umeda | 257/104 X |
| 5,066,929 | 11/1991 | Frantz | 315/97 X |
| 5,166,761 | 11/1992 | Olson et al. | 257/104 X |

OTHER PUBLICATIONS

G.E. Tunnel Diode Manual (1961) pp. 14–15 "Ratings and Characteristics".
"ABC's of Tunnel Diodes"–Peter Galaan SAMS Cat #TDK-1.
Technology Advances, "Electrochemical Process Promises to Make Silicon a Light Emitter"–John Gosch–*Electronic Design* Sep. 12, 1991 (no pp.).
*NASA Tech Briefs*, "Alternating Gradient Photodetector for Far Infrared" Albert Overhauser & Joseph Maserjian (NASA's Jet Propulsion Lab.) 1989 (Nov. p. 26).
Technology Newsletter, *Electronic Design*–Penton Publishing, Inc. Cleveland, Ohio–Jan. 10, 1991 "Indium Tin Oxide to Improve Image Sensors" (no pp. stated).
*Encyclopedia of Semiconductor Technology*, Encyclopedia Reprint Series (c) 1984 John Wiley & Sons, N.Y., N.Y. "Semiconductors (Theory & Application)" pp. 721–722.
*Pictorial Handbook of Technical Devices*–Otto Schwarz & Paul Grafstein, "Magnetics & Electronics" pp. 296–297, Chemical Publ. N.Y., N.Y. 1971.
*analog Electronics Handbook*–T. H. Collins, Prentice Hall, N.Y., N.Y. (1989) pp. 140–141.
*Thin Film Phenomena*–Kasturi L. Chopra, McGraw-Hill, N.Y., N.Y. (1969) "Transport Phenomena in Insulator Films" pp. 516–519, 526–527.
*Electronics for Nuclear Instrumentation Theory and Application*, Hai Hung Chiang, Robert E. Krieger Publishing Co., Malabar, Fla. 1985 pp. 102–103.

*Primary Examiner*—David Mis
*Attorney, Agent, or Firm*—Stetina and Brunda

[57] ABSTRACT

A light emitting tunnel diode oscillator comprising a body of single crystalline material having a first portion n-doped and a second portion p-doped in such a way that the resulting p-n junction has the low voltage conductance characteristics of a tunnel diode as well as characteristics of light emission.

The light emitting tunnel diode oscillator comprises a plurality of alternately layered n-doped portions and p-doped portions.

a light emitting tunnel diode oscillator wherein said first n-doped portion and said second p-doped portion are formed to have a thickness corresponding to an integral number of desired wave lengths.

3 Claims, 2 Drawing Sheets

LIGHT EMITTING TUNNEL DIODE OSCILLATOR

FIELD OF THE INVENTION

The present invention relates to light emitting diodes, and more particularly to light emitting diodes that are enabled as a consequence of a light frequency signal generated by tunnel diodes biased to a self-oscillating operational point.

BACKGROUND OF THE INVENTION

Light emitting diodes operate to release light photons as electrons transition between excited and resting states. In order to conventionally initiate the release of light photons, a sufficient voltage must be applied to the light emitting diodes, e.g. 1.2 volts. The present invention is directed to a construction for enabling light emitting diodes to emit light photons with a reduced applied voltage, using the characteristics of a tunnel diode.

Tunnel diodes are well known and are commonly utilized as a self-excited frequency down converter. One characteristic of a tunnel diode is its ability to be biased to a self-oscillating operating point. By proper sizing of the tunnel diode junction cross-section, a tunnel diode may be biased to self-oscillation, outputting a high frequency signal. Prior publications have disclosed constructing and biasing a tunnel diode circuit to output signals in the tunable FM frequency range, e.g. *GE Tunnel Diode Manual*, G.E., Syracuse, N.Y. (1961) and *ABC's of Tunnel Diodes*, Gallan, P., SAMS Catalog #TDK-1.

The present invention is directed to a modification of prior uses of a tunnel diode circuit to bias a tunnel diode to tunably self-oscillate in the visual frequency range. The tunnel diode output signal is then used to drive a light emitting diode. As a consequence of the frequency of the tunnel diode output signal the light emitting diode can be excited to emit photons, i.e. to emit light, by resonant pumping, without the need to apply conventional voltage levels to activate the light emitting diode, e.g. approximately 1.2 volts.

SUMMARY OF THE INVENTION

A light emitting tunnel diode oscillator comprising a body of single crystalline material having a first portion n-doped and a second portion p-doped in such a way that the resulting p-n junction has the low voltage conductance characteristics of a tunnel diode as well as characteristics of light emission.

The light emitting tunnel diode oscillator comprises a plurality of alternately layered n-doped portions and p-doped portions.

A light emitting tunnel diode oscillator wherein said first n-doped portion and said second p-doped portion are formed to have a thickness corresponding to an integral number of desired wave lengths.

DETAILED DESCRIPTION OF THE PREFERRED EMBODIMENT

The detailed description set forth below in connection with the appended drawings is intended merely as a description of the presently preferred embodiments of the invention, and is not intended to represent the only form in which the present invention may be constructed or utilized. The description sets forth the functions and sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

Figure 1:
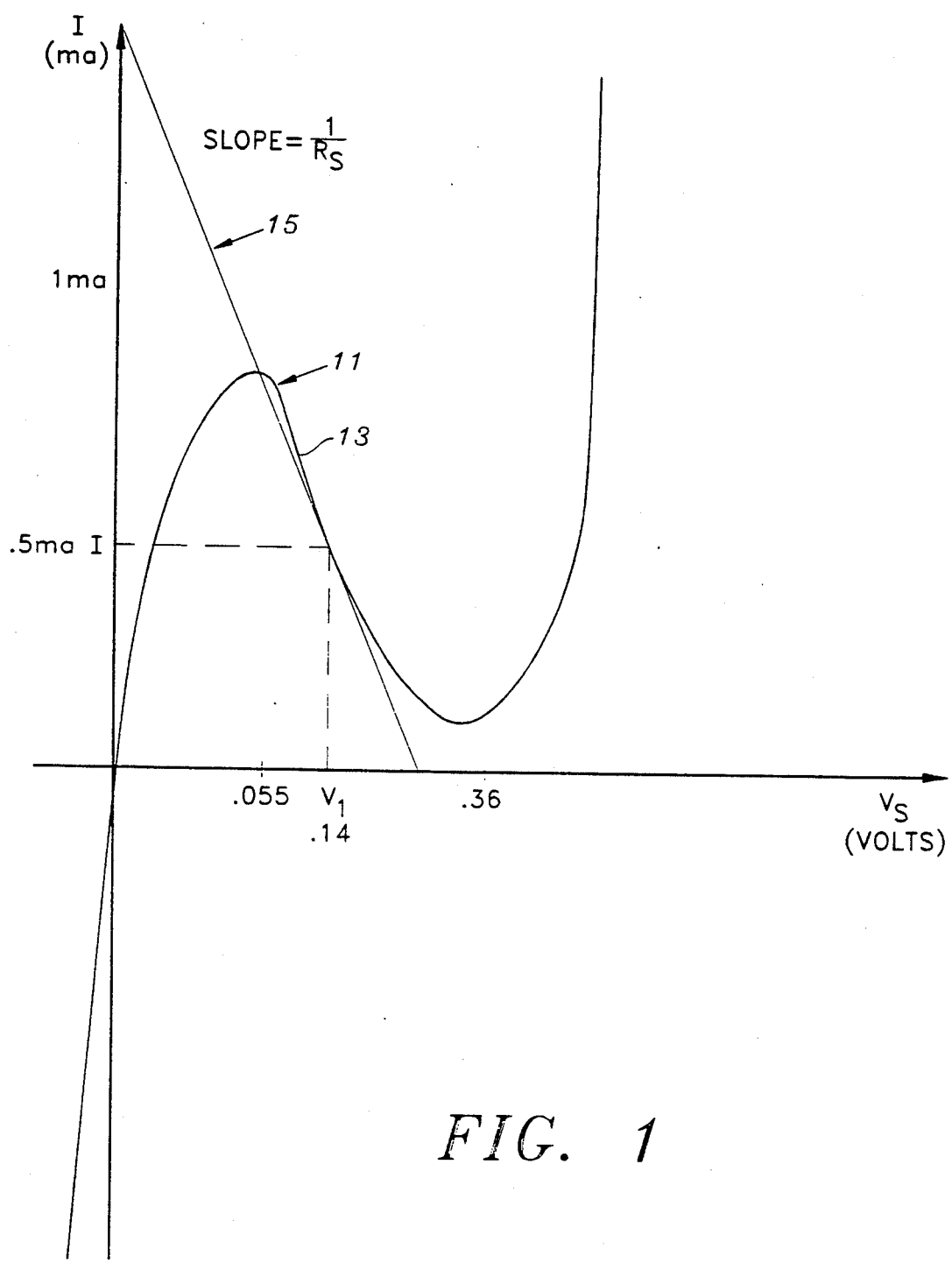
FIG. 1 is a graph illustrating the operation of a tunnel diode biased to self-oscillate in the visual light frequency range.

FIG. 1 illustrates the operation of a tunnel diode biased to a self-oscillating condition. The steep negative slope portion 13 of the tunnel diode operating curve 11 may be used to create a self-oscillating condition (i.e. $V_1 = 0.14$ v, $I_1 = \approx 0.5$ mAmps, (dependant on junction cross-sectional area) along load line 15 for a substantially fixed voltage level $V_1$. For example, a tunnel diode operating consistent with FIG. 1 would oscillate when biased to an operating point, corresponding to about a 0.14 volt operating condition. As those of ordinary skill in the art will recognize, variations in the construction of the tunnel diode will vary its operating conditions, e.g. change its tendency to oscillate, as well as the point at which it will oscillate. Variations in the construction of the tunnel diode, e.g. the thickness of the wafer material and the available surface area, will also modify the frequency range at which the tunnel diode may be induced to self-oscillation.

Figure 2:
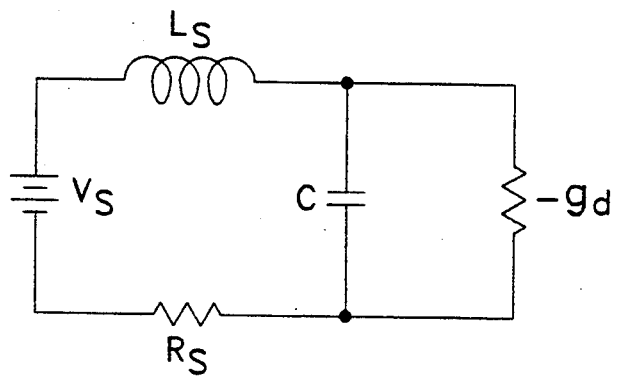
FIG. 2 is a schematic diagram illustrating small signal equivalent circuit for a tunnel diode and accompanying bias circuitry.

FIG. 2 is a schematic diagram illustrating a tunnel diode and accompanying bias circuitry. Two significant frequencies are assigned to the tunnel diode:

(a) resistive cut-off frequency, $$f_{ro} = \frac{|g_d|}{2\pi C} \sqrt{\frac{1}{R_s |g_d|} - 1} \qquad (2.1)$$

(b) self-resonant frequency $$f_{xo} = \frac{1}{2\pi} \sqrt{\frac{1}{L_s C} - \left(\frac{g_d}{C}\right)^2} \qquad (2.2)$$

Both these frequencies are derived from the equivalent circuit of FIG. 2. The resistive cut-off frequency is the frequency at which the real part of the diode impedance measured at its terminals goes to zero. The tunnel diode can not amplify above this frequency. The self-resonant frequency is the frequency at which the imaginary part of the diode impedance goes to zero. Both frequencies are reduced by external circuit components and therefore the highest possible operating frequency is very circuit dependent.

Having biased the tunnel diode to generate an output signal in the visual frequency range, it operates as a light source. The self-oscillating frequency is preferably selected in conjunction with the desired color, i.e. the operating frequency range, of the light emitting diode. Thus, a tunnel diode constructed to self-oscillate in the frequency range of the color yellow is used to emit a yellow color signal.

Pulsing the light emitting diode at its operating frequency range, causes the emission of light photons. The frequency selective technique of the present invention permits activation of the light emitting diode at lower voltage levels than would normally be required for the light emitting diodes to be sufficiently excited to release light photons.

As will be apparent to those of ordinary skill in the art, the particular combination of frequency and voltage levels necessary to activate light emitting diodes will vary with the construction of the light emitting diode. Moreover, the level of overdoping necessary to provide tunnel diode characteristics will also vary with the construction of the light emitting diode.

Though it is anticipated that the present invention may be implemented in various forms, each form of the invention would incorporate the tunnel diode and light emitting diode as integral components of the single device. For example, single crystalline material could be p-doped to provide a region of LED material and n-doped to provide a region of tunnel diode material. A multi-layer construction could thus be provided such a multi-layer construction would provide the functionality of both the tunnel diode and the light emitting diode, as driven by the tunnel diode.

Figure 3:
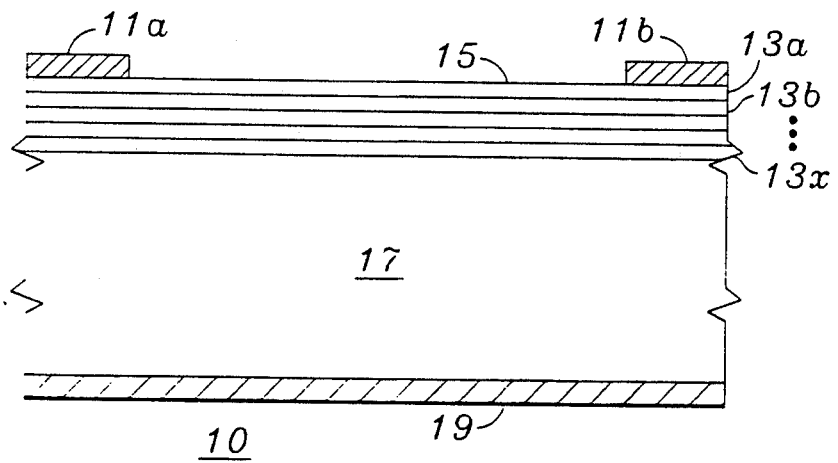
FIG. 3 is an illustration of an exemplary integral tunnel diode/light emitting diode formed in accordance with the present invention.

FIG. 3 illustrates an exemplary construction of integral tunnel diode/light emitting diode 10, formed in accordance with the present invention. Contacts 11a and 11b communicate signals to and from the device 10, which is formed of a plurality of alternately doped layers 13a, 13b . . . 13x. The layers may be alternately doped n− or n+, with an n++ substrate 15, an n++ transparent contact 17 and a back metal contact 19. The n+ layers may be formed of heavily doped (n+) germanium layers having a thickness a, and n lightly doped (n−) germanium layers of thickness b. The concentration, n+, of dopant in the heavily doped layers could be tailored for specific applications in accordance with the desired band response. As will be apparent to those of ordinary skill in the art, other modifications and improvements may be made without departing from the broader novel aspects of the invention. For example, the tunnel diode may be constructed to permit self-oscillation at frequency ranges beyond the visual frequency range.

What is claimed is:

1. A light emitting tunnel diode oscillator comprising a body of single crystalline material having a first portion n-doped and a second portion p-doped in such a way that the resulting p-n junction has the low voltage conductance characteristics of a tunnel diode as well as characteristics of light emission.

2. The light emitting tunnel diode oscillator as recited in claim 1 comprising a plurality of alternately layered n-doped portions and p-doped portions.

3. A light emitting tunnel diode oscillator as cited in claim 1 wherein said first n-doped portion and said second p-doped portion are formed to have a thickness corresponding to an integral number of desired wave lengths.

* * * * *